(12) United States Patent
Izumi et al.

(10) Patent No.: US 10,796,877 B2
(45) Date of Patent: Oct. 6, 2020

(54) CHARGED PARTICLE BEAM IMAGE ACQUISITION APPARATUS

(71) Applicant: NUFLARE TECHNOLOGY, INC., Kanagawa (JP)

(72) Inventors: Yoshihiro Izumi, Yokohama (JP); Hideki Ito, Kawasaki (JP); Toshikatsu Akiba, Kisarazu (JP)

(73) Assignee: NUFLARE TECHNOLOGY, INC., Kanagawa (JP)

( * ) Notice: Subject to any disclaimer, the term of this patent is extended or adjusted under 35 U.S.C. 154(b) by 0 days.

(21) Appl. No.: 16/434,897

(22) Filed: Jun. 7, 2019

(65) Prior Publication Data

US 2020/0006031 A1   Jan. 2, 2020

(30) Foreign Application Priority Data

Jun. 27, 2018   (JP) .................. 2018-122081

(51) Int. Cl.
| | |
|---|---|
| *H01J 37/06* | (2006.01) |
| *H01J 37/20* | (2006.01) |
| *H01J 37/147* | (2006.01) |

(52) U.S. Cl.
CPC .......... *H01J 37/06* (2013.01); *H01J 37/1472* (2013.01); *H01J 37/20* (2013.01); *H01J 2237/20228* (2013.01); *H01J 2237/2448* (2013.01); *H01J 2237/2817* (2013.01)

(58) Field of Classification Search
CPC .. H01J 37/00; H01J 37/02; H01J 37/06; H01J 37/063; H01J 37/065; H01J 37/147; H01J 37/16; H01J 37/26; H01J 37/261

USPC .............. 250/306, 307, 311, 396 R
See application file for complete search history.

(56) References Cited

U.S. PATENT DOCUMENTS

| | | | |
|---|---|---|---|
| 5,432,831 A | 7/1995 | Nagai et al. | |
| 2002/0109090 A1* | 8/2002 | Nakasuji | H01J 37/222 250/311 |
| 2012/0193550 A1* | 8/2012 | Tsuji | H01J 37/28 250/396 R |
| 2016/0133437 A1* | 5/2016 | Moers | H01J 37/02 250/307 |
| 2017/0250054 A1* | 8/2017 | Takahashi | H01J 37/261 |

FOREIGN PATENT DOCUMENTS

JP   6-94900 A   4/1994

* cited by examiner

*Primary Examiner* — Jason L McCormack
(74) *Attorney, Agent, or Firm* — Cermak Nakajima & McGowan LLP; Tomoko Nakajima (57) ABSTRACT

According to one aspect of the present invention, a charged particle beam image acquisition apparatus includes a rectangular parallelepiped chamber where a target object is disposed; a primary electron optical column placed on an upper surface of the chamber so that a point of intersection between two diagonal lines on the upper surface of the chamber is located at a center of a horizontal section of the primary electron optical column, a primary charged particle beam optics irradiating the target object with a primary charged particle beam being disposed in the primary electron optical column; and a secondary electron optical column connected to a lower portion of the primary electron optical column, a secondary charged particle beam optics being disposed in the secondary electron optical column and a secondary charged particle beam passing through the secondary charged particle beam optics.

9 Claims, 7 Drawing Sheets

| | a | b | c | d | e |
|---|---|---|---|---|---|
| Vacuum | 0 | 0 | 0 | 0 | 0 |
| Atmospheric | 20 | 20 | 20 | 21 | -1 |

CHARGED PARTICLE BEAM IMAGE ACQUISITION APPARATUS

CROSS-REFERENCE TO RELATED APPLICATION

This application is based upon and claims the benefit of priority from prior Japanese Patent Application No. 2018-122081 filed on Jun. 27, 2018 in Japan, the entire contents of which are incorporated herein by reference.

BACKGROUND OF THE INVENTION

Field of the Invention

One aspect of the embodiments relates to a charged particle beam image acquisition apparatus as an inspection apparatus which, for example, acquires a secondary electron image of a pattern emitted by irradiation with multiple electron beams that are charged particle beams and inspects the pattern.

Related Art

In recent years, the circuit line width that is required for a semiconductor element is becoming increasingly narrow as large-scale integrated circuits (LSI) are improved in terms of integration and capacity. In addition, yield improvement is indispensable in LSI manufacturing entailing very high manufacturing costs. However, as represented by a 1 gigabit-class random access memory (DRAM), patterns constituting an LSI are on the order of submicron to nanometer. In recent years, the dimensions that should be detected as pattern defects have become extremely small as the dimensions of LSI patterns formed on semiconductor wafers become increasingly fine. Accordingly, there is a need to enhance the precision of a pattern inspection apparatus that inspects defects of an ultrafine pattern transferred on a semiconductor wafer. Major yield-declining factors include a pattern defect of a mask that is used during photolithography-based ultrafine pattern exposure and transfer on a semiconductor wafer. Accordingly, there is a need to enhance the precision of a pattern inspection apparatus that inspects a defect of a transfer mask used for LSI manufacturing.

An inspection method is known by which comparison is performed between a measurement image obtained by imaging of a pattern formed on a substrate such as a lithography mask and a semiconductor wafer and design data or a measurement image obtained by imaging of the same pattern on the substrate. Examples of the pattern inspection method include die-to-die inspection and die-to-database inspection. By the former method, inter-measurement image data comparison is performed after the same pattern in different places on the same substrate is imaged. By the latter method, design image data (reference image) is generated on the basis of pattern-designed design data and comparison is performed between the design image data and a measurement image as measurement data resulting from pattern imaging. The captured images are sent to a comparison circuit as measurement data. The comparison circuit compares the measurement data and the reference data in accordance with an appropriate algorithm after alignment of the images. In the case of non-matching, the comparison circuit determines that there is a pattern defect.

In progress regarding the pattern inspection apparatuses described above are the development of an apparatus irradiating an inspection target substrate with laser light and capturing a transmission or reflection image of the inspection target substrate and an inspection apparatus acquiring a pattern image by performing scanning on an inspection target substrate with, for example, an electron beam as a charged particle beam and detecting a secondary electron emitted from the inspection target substrate as a result of electron beam irradiation. Regarding the electron beam-based inspection apparatus, the development of apparatuses using multiple beams is in progress as well. As for electron beam image acquisition apparatuses including such inspection apparatuses, it is necessary to maintain electron beam irradiation and detection environments in a vacuum state. Accordingly, a target object to be irradiated with an electron beam needs to be disposed in a vacuum chamber. The target object is irradiated with the electron beam by means of an irradiation optics that is disposed in an electron optical column positioned above the chamber. In addition, a secondary electron is detected by means of a detection optics disposed in the electron optical column positioned above the chamber. In a case where the inside of the chamber is maintained in a vacuum state, the differential pressure between the internal pressure of the chamber and atmospheric pressure results in chamber deformation. As a result, an error arises in the relative positional relationship between the target object irradiated with the beam and the irradiation optics and the detection optics, and then no high-precision image can be acquired with ease.

Disclosed regarding such vacuum container deformation is optics placement on a member that is supported at a part which has a small amount of displacement transmitted to an optics as a result of vacuum container deformation attributable to a pressure change in the vacuum container (see, for example, Japanese Unexamined Patent Application No. 06-094900). However, it is not easy to support every optics element at a part with a small displacement amount in an electron beam irradiation apparatus.

BRIEF SUMMARY OF THE INVENTION

According to one aspect of the present invention, a charged particle beam image acquisition apparatus includes:

a rectangular parallelepiped chamber where a target object is disposed;

a primary electron optical column placed on an upper surface of the chamber so that a point of intersection between two diagonal lines on the upper surface of the chamber is located at a center of a horizontal section of the primary electron optical column, a primary charged particle beam optics irradiating the target object with a primary charged particle beam being disposed in the primary electron optical column; and a secondary electron optical column connected to a lower portion of the primary electron optical column, a secondary charged particle beam optics being disposed in the secondary electron optical column and a secondary charged particle beam emitted as a result of an irradiation of the target object with the primary charged particle beam passing through the secondary charged particle beam optics.

DETAILED DESCRIPTION OF THE INVENTION

The following embodiment describes an apparatus and a method for facilitating correction of an error in positional relationship, even in the event of chamber deformation attributable to the differential pressure between the internal pressure of a chamber and atmospheric pressure, by vacuumizing the inside of the chamber.

Described in the following embodiment is a case where an electron beam is used as an example of a charged particle beam. An apparatus using multiple beams as an example of electron beams will be described as well. However, the electron beams are not limited to the multiple beams and the electron beam may be a single beam instead. In addition, an inspection apparatus will be described as an example of an electron beam image acquisition apparatus. However, the electron beam image acquisition apparatus is not limited to the inspection apparatus. For example, the electron beam image acquisition apparatus may instead be an apparatus that emits an electron beam allowing image acquisition.

Embodiment 1

Figure 1:
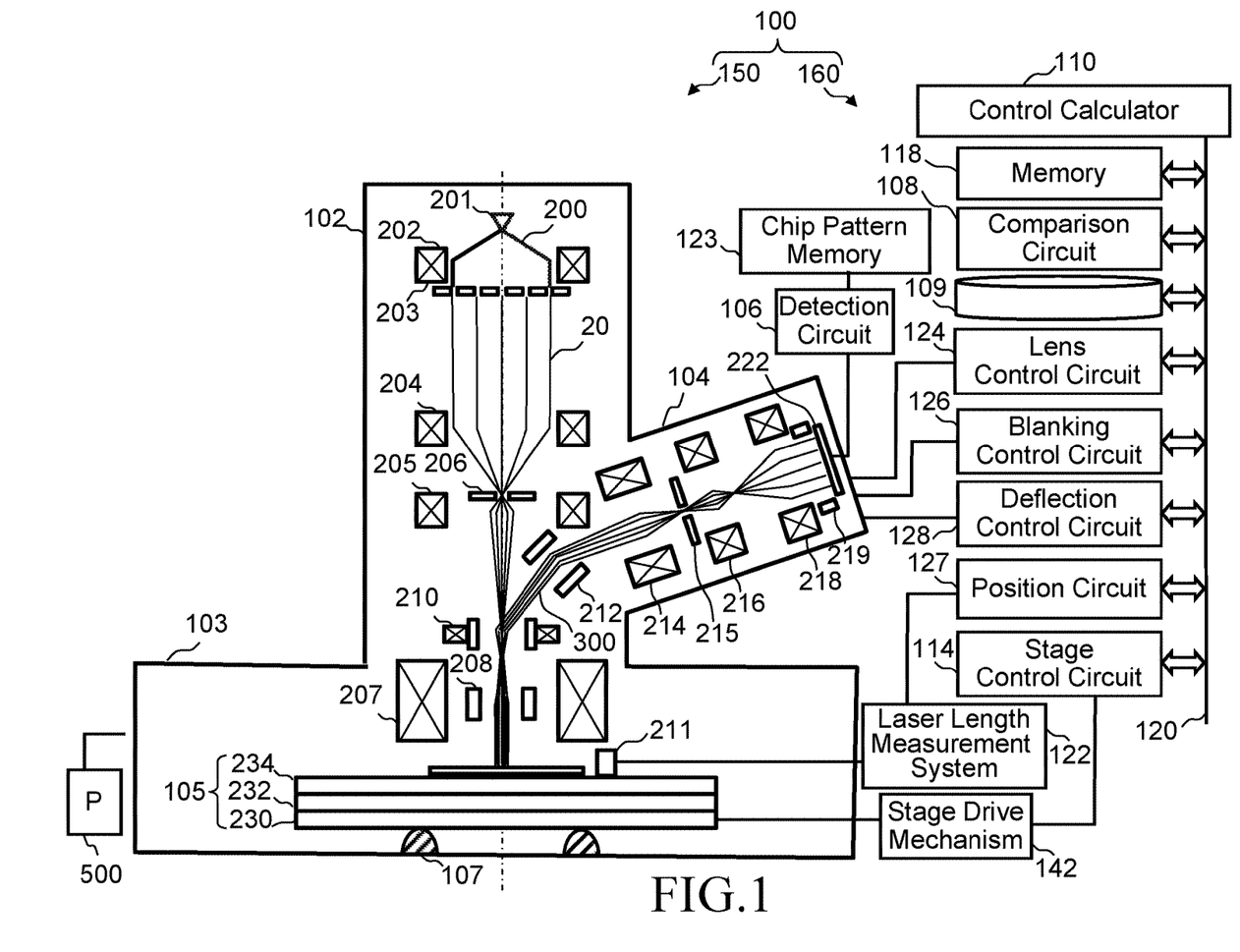
FIG. 1 is a configuration diagram illustrating the configuration of a pattern inspection apparatus according to Embodiment 1.

FIG. 1 is a configuration diagram illustrating the configuration of a pattern inspection apparatus according to Embodiment 1. In FIG. 1, an inspection apparatus 100 inspecting a pattern formed on a substrate is an example of a multiple electron beam inspection apparatus. The inspection apparatus 100 is provided with an image acquisition mechanism 150 and a control system circuit 160. The image acquisition mechanism 150 is provided with a primary electron beam column 102 (also referred to as a primary electron optical column), an inspection chamber 103 (chamber), a secondary electron beam column 104 (also referred to as a secondary electron optical column), a detection circuit 106, a chip pattern memory 123, a stage drive mechanism 142, and a laser length measurement system 122.

Disposed in the primary electron beam column 102 are an electron gun assembly 201, an electromagnetic lens 202, a shaping aperture array substrate 203, an electromagnetic lens 204, a limiting aperture substrate 206, an electromagnetic lens 205, an objective lens 207, a deflector 208, a beam separator 210, and a deflector 212. Disposed in the secondary electron beam column 104 are a projection lens 214, a limiting aperture substrate 215, a projection lens 216, a projection lens 218, a deflector 219, and a detector 222. In the example of FIG. 1, the electron gun assembly 201, the electromagnetic lens 202, the shaping aperture array substrate 203, the electromagnetic lens 204, the limiting aperture substrate 206, the electromagnetic lens 205, the objective lens 207, and the deflector 208 are examples of what constitute a primary electron beam optics (primary charged particle beam optics). In addition, the beam separator 210, the deflector 212, the projection lens 214, the limiting aperture substrate 215, the projection lens 216, the projection lens 218, the deflector 219, and the detector 222 are examples of what constitute a secondary electron beam optics (secondary charged particle beam optics). In other words, a primary electron beam optics irradiating a substrate 101 (target object) with a primary electron beam is disposed in the primary electron beam column 102. Disposed in the secondary electron beam column 104 is a secondary electron beam optics through which a secondary electron beam emitted as a result of the primary electron beam irradiation of the substrate 101 passes.

A stage 105 is disposed in the inspection chamber 103. The stage 105 is movable at least on an XY plane and in a height (Z) direction. In the stage 105, an XY stage 232 movable on, for example, the XY plane is disposed on a base 230 and a Z stage 234 movable in the Z direction is disposed on the XY stage 232. The stage 105 is supported by a plurality of stage pedestals 107, which are three or more in number and disposed on the bottom plate inside surface of the inspection chamber 103. Specifically, the plurality of stage pedestals 107, which are three or more in number, support the base 230. In addition, the inside of the inspection chamber 103 is vacuumized by a vacuum pump 500. Likewise, the inside of the primary electron beam column 102 and the inside of the secondary electron beam column 104 are vacuumized by a vacuum pump.

The substrate 101 (target object), which is an inspection target, is disposed on the XY stage 105. The substrate 101 includes a semiconductor substrate such as a silicon wafer and an exposure mask substrate. In a case where the substrate 101 is a semiconductor substrate, the semiconductor substrate has a plurality of chip patterns (wafer dies). In a case where the substrate 101 is an exposure mask substrate, the exposure mask substrate has a chip pattern. A plurality of figures constitute the chip pattern. The plurality of chip patterns (wafer dies) are formed on the semiconductor substrate by the chip pattern formed on the exposure mask substrate is exposed and transferred onto the semiconductor substrate more than once. A case where the substrate 101 is a semiconductor substrate will be mainly described below. The substrate 101 is disposed on the XY stage 105 with, for example, a pattern formation surface facing upward. Also disposed on the XY stage 105 is a mirror 211 reflecting laser light for laser length measurement that is emitted from the laser length measurement system 122, which is disposed outside the inspection chamber 103. The detector 222 is connected to the detection circuit 106 outside the secondary electron beam column 104. The detection circuit 106 is connected to the chip pattern memory 123.

In the control system circuit 160, a control calculator 110 controlling the entire inspection apparatus 100 is connected via a bus 120 to a position circuit 127, a comparison circuit 108, a stage control circuit 114, a lens control circuit 124, a blanking control circuit 126, a deflection control circuit 128, a storage device 109 such as a magnetic disk drive, and a memory 118.

The chip pattern memory 123 is connected to the comparison circuit 108. The XY stage 105 is driven by the stage drive mechanism 142 under the control of the stage control circuit 114. The movement position of the XY stage 105 is measured by the laser length measurement system 122 and supplied to the position circuit 127. The laser length measurement system 122 performs length measurement on the position of the XY stage 105 by the principle of laser interferometry by receiving reflected light from the mirror 211.

A high-voltage power supply circuit (not illustrated) is connected to the electron gun assembly 201. Application of an acceleration voltage from the high-voltage power supply circuit to the space between an extraction electrode and a filament (not illustrated) in the electron gun assembly 201 is performed along with application of a voltage of a predetermined extraction electrode (Wehnelt) and heating of a cathode at a predetermined temperature. As a result, an electron group emitted from the cathode is accelerated and emitted as an electron beam 200. Each of the electromagnetic lenses 202, 204, and 205, the objective lens 207, the projection lenses 214, 216, and 218, and the beam separator 210 is controlled by the lens control circuit 124. Each of the deflector 208, the deflector 212, and the deflector 219 includes, for example, four or more electrodes and is controlled by the deflection control circuit 128 with every electrode connected to the deflection control circuit 128 via a digital-to-analog conversion (DAC) amplifier (not illustrated).

In the shaping aperture array substrate 203, holes (opening portions) are formed at a predetermined arrangement pitch in the x and y directions. The holes are two-dimensionally formed $m_1$ columns wide (x direction) and $n_1$ stages long (y direction) ($m_1$ and $n_1$ being integers of 2 or more). The electron beam 200 partially passes through each of the plurality of holes, and for example, a plurality of electron beams (multiple primary electron beams 20) are formed as a result.

Illustrated in FIG. 1 are configurations necessary for description of Embodiment 1. On normal occasions, the inspection apparatus 100 may be provided with other configurations as necessary.

Next, operation of the image acquisition mechanism 150 in the inspection apparatus 100 will be described.

The electron beam 200 emitted from the electron gun assembly 201 (emission source) illuminates the entire shaping aperture array substrate 203 by the electromagnetic lens 202. The shaping aperture array substrate 203 has a plurality of holes (opening portions) as described above, and the electron beam 200 illuminates a region including all of holes. The parts of the electron beam 200 emitted to the positions of the holes respectively pass through the holes of the shaping aperture array substrate 203. Formed as a result are, for example, multiple primary electron beams 20.

The formed multiple primary electron beams 20 are refracted, by the electromagnetic lens 204, toward a central hole formed in the limiting aperture substrate 206. In a case where all of the multiple primary electron beams 20 are collectively deflected by a batch blanking deflector (not illustrated), positional deviation from the central hole of the limiting aperture substrate 206 and shielding by the limiting aperture substrate 206 occur. The multiple primary electron beams 20 not deflected by the batch blanking deflector pass through the central hole of the limiting aperture substrate 206 as illustrated in FIG. 1. Collective blanking control is performed on all of the multiple primary electron beams 20 by ON/OFF of the batch blanking deflector and beam ON/OFF is collectively controlled. After the passage through the limiting aperture substrate 206, the multiple primary electron beams 20 are refracted by the electromagnetic lens 205 and form a crossover (C.O.). The beam separator 210 is disposed near the position of the crossover. After passing through the beam separator 210, the multiple primary electron beams 20 are focused on the surface of the substrate 101 (target object) by the objective lens 207 and become a pattern image (beam diameter) of a desired reduction ratio. The deflector 208 collectively deflects all of the multiple primary electron beams 20 in the same direction, and each of the beams is emitted to the irradiation position of the beam on the substrate 101.

By the desired positions of the substrate 101 being irradiated with the multiple primary electron beams 20, a bundle of secondary electrons (multiple secondary electron beams 300, dotted line in FIG. 1) is emitted from the substrate 101. The secondary electrons include reflected electrons and correspond to the respective beams of the multiple primary electron beams 20.

The multiple secondary electron beams 300 emitted from the substrate 101 are refracted to the center side of the multiple secondary electron beams 300 by the objective lens 207 and proceed to the beam separator 210. Then, the multiple secondary electron beams 300 are separated from the trajectory of the multiple primary electron beams 20 by the beam separator 210 and are bent diagonally upward.

After being bent diagonally upward, the multiple secondary electron beams 300 are further bent (deflected) by the deflector 212 to head in the direction of the detection surface of the detector 222 and proceed to the projection lens 214. The multiple secondary electron beams 300 heading in the direction of the detection surface of the detector 222 are refracted, by the projection lens 214, toward a central hole formed in the limiting aperture substrate 215. Scattered electrons are shielded by the limiting aperture substrate 215. After passing through the limiting aperture substrate 215, the multiple secondary electron beams 300 are emitted to desired positions of the detection surface of the detector 222 by the projection lenses 216 and 218. The reflected electrons of the multiple secondary electron beams 300 may reach the detection surface of the detector 222 or may not reach the detection surface of the detector 222 by diverging halfway the path. In addition, tracking deflection following the movement of the stage 105 is performed by the deflector 208 so that scanning is performed while the stage 105 is continuously moved. The deflector 219 deflects the multiple secondary electron beams 300, such that the desired positions on the light receiving surface of the detector 222 are irradiated with the multiple secondary electron beams 300, in accordance with the deflection position movement resulting from the tracking deflection and the scanning operation. The detector 222 detects the emitted multiple secondary electron beams 300. Then, an image on the substrate 101 is formed by an intensity signal detected by the detector 222.

Figure 2A:
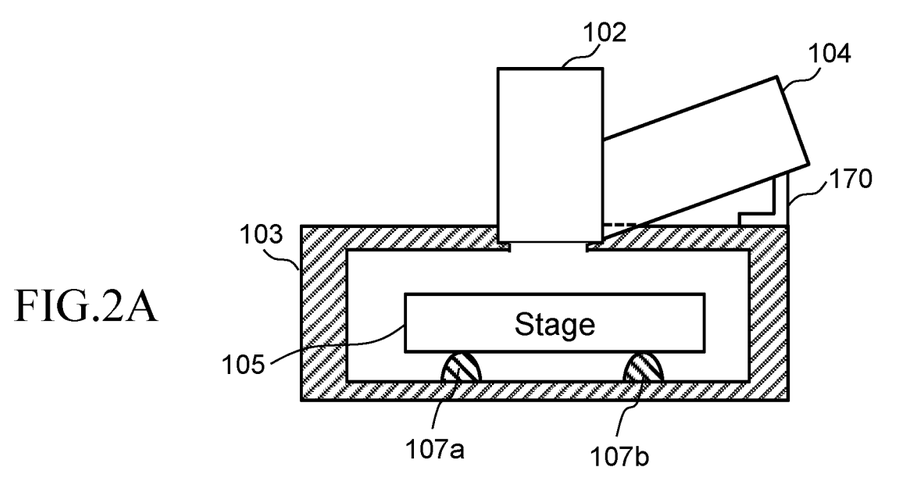
FIGS. 2A and 2B are diagrams exemplifying under-atmospheric pressure and under-vacuum chamber states according to Embodiment 1.
Figure 2B:
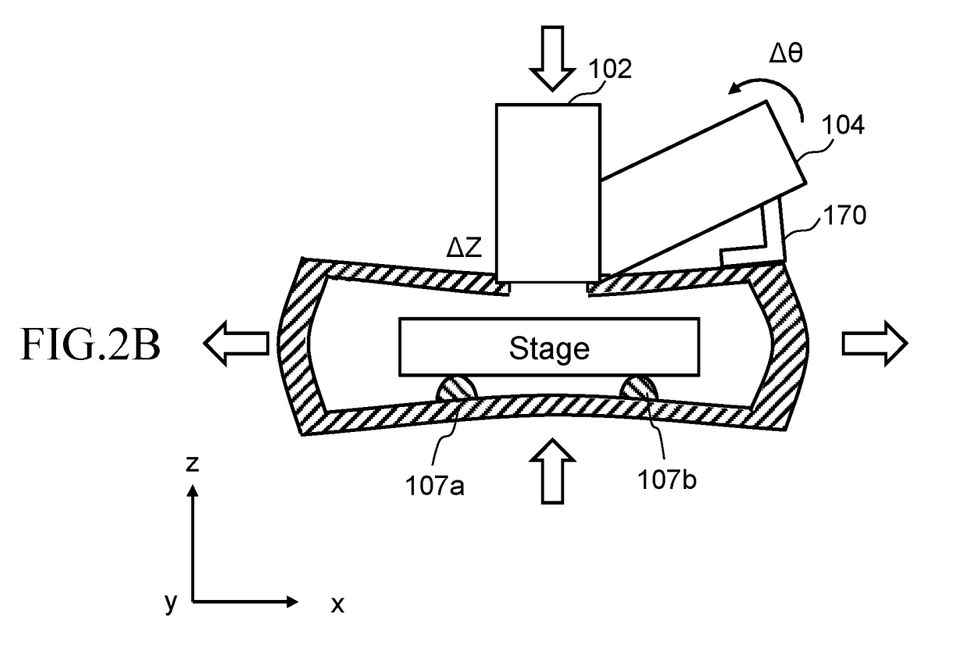

Exemplified in FIGS. 2A and 2B is under-atmospheric pressure and under-vacuum chamber states according to Embodiment 1. As illustrated in FIG. 2A, the inspection chamber 103 (chamber) is not deformed under atmospheric pressure. Under vacuum, however, the inspection chamber 103 is deformed due to the differential pressure between the inside and the outside of the chamber as illustrated in FIG. 2B. The inspection chamber 103 is formed of a rectangular parallelepiped. In the example of FIG. 2B, in particular, the inspection chamber 103 is formed of a flat rectangular parallelepiped that is short in the height direction (Z direction). In this case, the upper and lower surfaces are deformed inward and the lateral direction is deformed outward under vacuum. Accordingly, the positions of the primary electron beam column 102 and the secondary electron beam column 104 disposed on the inspection chamber 103 deviate. In addition, the position of the stage 105 in the inspection chamber 103 deviates. As a result, the positional relationship between the substrate 101 and the primary electron beam optics and the positional relationship between the substrate 101 and the secondary electron beam optics deviate. Such deviations may occur in the xyz directions and the direction of rotation. As a result, the beam irradiation position deviates, the secondary electron deviates from a desired detection surface of the detector 222, and no high-precision image can be acquired with ease. In this regard, Embodiment 1 adopts a configuration for facilitating correction of an error in positional relationship even in the event of chamber deformation attributable to the differential pressure between the internal pressure of a chamber and atmospheric pressure.

Figure 3A:
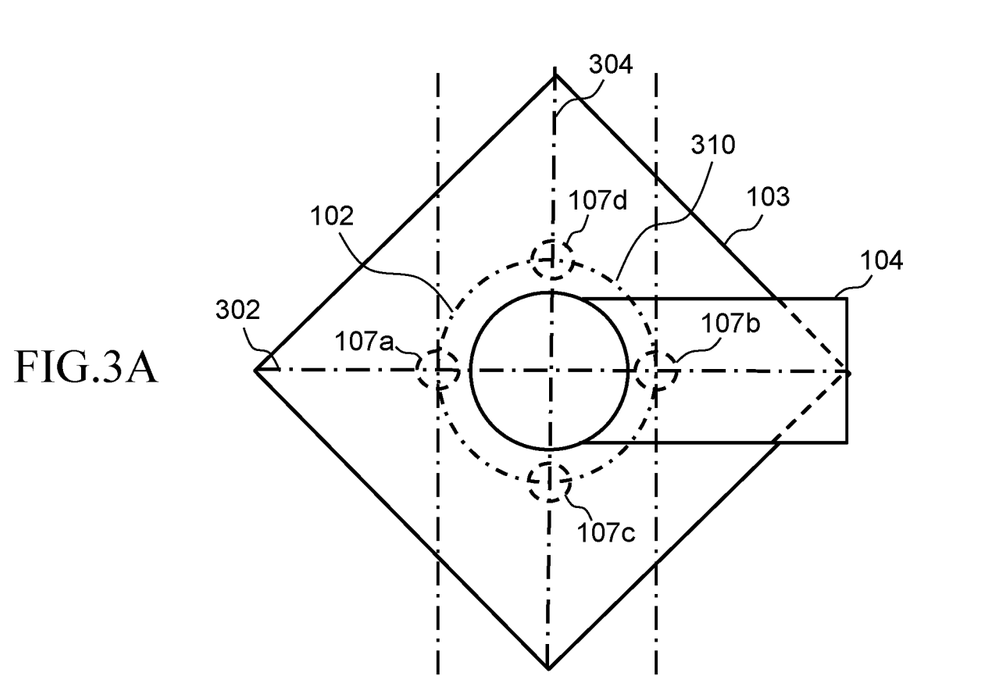
FIGS. 3A and 3B are diagrams exemplifying the disposition configuration of a primary electron beam column, an inspection chamber, and a secondary electron beam column according to Embodiment 1.
Figure 3B:
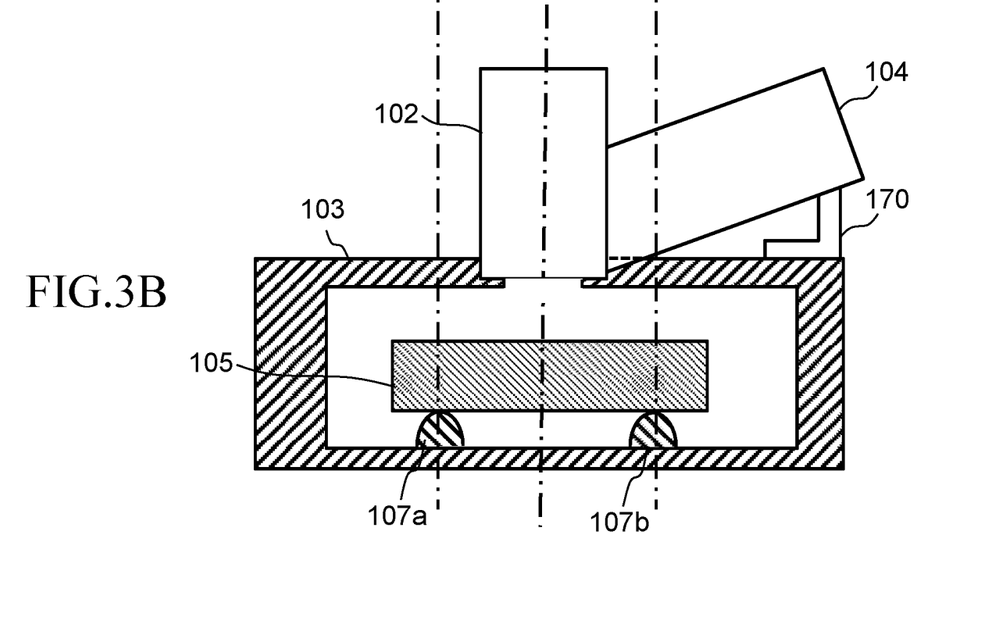

Exemplified in FIGS. 3A and 3B is the disposition configuration of the primary electron beam column, the inspection chamber, and the secondary electron beam column according to Embodiment 1. A top view is illustrated in FIG. 3A and a cross-sectional view is illustrated in FIG. 3B. Illustrated in the example of FIGS. 3A and 3B is, for example, a case where the inspection chamber 103 that is a flat rectangular parallelepiped, is short in the height direction (Z direction), and has square upper and lower surfaces is used. In addition, in the inspection chamber 103, plate material combination constitutes the six surfaces of the rectangular parallelepiped. As described with reference to FIG. 2B, the upper and lower surfaces of the inspection chamber 103 are deformed inward and the lateral direction of the inspection chamber 103 is deformed outward due to the differential pressure between the inside and the outside of the chamber. Accordingly, the upper surface of the inspection chamber 103 undergoes the maximum inward displacement at the center of the upper surface and displacement occurs while the displacement starting from the center of the upper surface uniformly decreases toward the outer side (x and y directions).

As illustrated in FIGS. 3A and 3B, in Embodiment 1, the primary electron beam column 102 (primary electron optical column) is placed on the upper surface of the inspection chamber 103 so that a point of intersection between two diagonal lines 302 and 304 on the upper surface of the rectangular parallelepiped inspection chamber 103 (chamber) is located at a center of a horizontal section (placement plane, for example) of the primary electron beam column 102. As a result, the primary electron beam column 102 is displaced only in the height (z) direction even in a case where the inspection chamber 103 is deformed. In other words, it is possible to concentrate on displacement in the height (z) direction without causing any deviation in the x and y plane directions and the direction of rotation. Specifically, the primary electron beam column 102 is displaced downward (in the −z direction) in a case where the inspection chamber 103 is deformed.

The secondary electron beam column 104 is connected to the lower portion of the primary electron beam column 102, supported by the connection to the lower portion of the primary electron beam column 102, and supported by a stay 170 in the outer peripheral portion of the upper surface of the inspection chamber 103. As for the stay 170, for example, the bottom surface of an L-shaped plate material is disposed in the outer peripheral portion of the upper surface of the inspection chamber 103 and the secondary electron beam column 104 is supported by the upper surface of the vertically rising plate material. In the example of FIGS. 3A and 3B, support is provided by the stay 170 disposed on one of the four corners of the upper surface of the inspection chamber 103. As a result, in a case where the inspection chamber 103 is deformed, simply a height-direction rotational error Δθ arises from the displacement of the primary electron beam column 102 to the lower side (in the −z direction) and the displacement of one corner of the upper surface of the inspection chamber 103 in the height (z) direction. In other words, it is possible to concentrate on the height-direction rotational error Δθ without causing any deviation in the x and y plane directions.

The bottom surface of the inspection chamber 103 has the maximum amplitude at the center of the bottom surface. Ideally, the bottom surface of the inspection chamber 103 undergoes a uniform displacement toward the outer side (x and y directions). Accordingly, in Embodiment 1, a plurality of stage pedestals 107a to 107d, which are three or more in number, are disposed on a same contour line 310 in a state of being deformed by the differential pressure between the internal and external pressures of the inspection chamber 103 on the bottom plate inside surface of the inspection chamber 103 (chamber) as illustrated in FIGS. 3A and 3B. Illustrated in the example of FIGS. 3A and 3B is a case where the number of the disposed stage pedestals 107a to 107d is four. The stage 105 is supported by the plurality of stage pedestals 107a to 107d. As a result, the stage pedestals 107a to 107d are capable of having the same height position even in a case where the inspection chamber 103 is deformed. Accordingly, the stage 105 is displaced only in the height (z) direction. In other words, it is possible to concentrate on displacement in the height (z) direction without causing any deviation in the x and y plane directions and the direction of rotation.

Figure 4A:
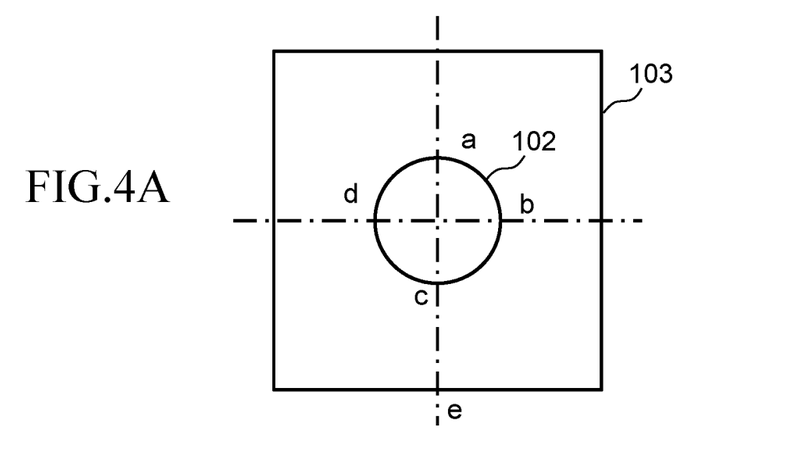
FIGS. 4A and 4B are diagrams illustrating an example of measurement points for measuring under-atmospheric pressure chamber displacement and under-vacuum chamber displacement according to Embodiment 1.
Figure 4B:
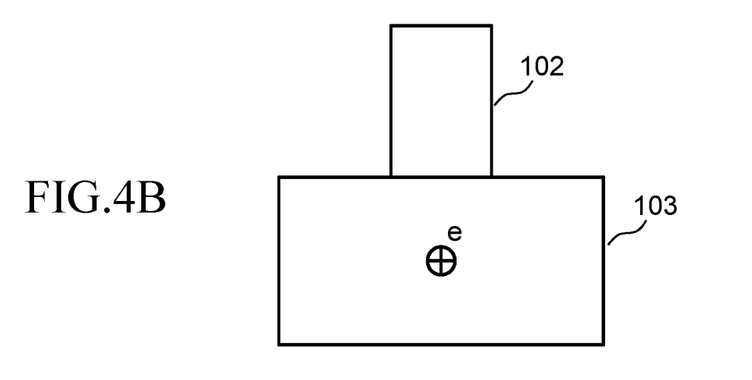

FIGS. 4A and 4B are diagrams illustrating an example of measurement points for measuring under-atmospheric pressure chamber displacement and under-vacuum chamber displacement according to Embodiment 1. A top view of the inspection apparatus 100 is illustrated in part in FIG. 4A. A side view of the inspection apparatus 100 is illustrated in part in FIG. 4B. The secondary electron beam column 104 is not illustrated in FIGS. 4A and 4B. The primary electron beam column 102 (primary electron optical column) is placed on the upper surface of the inspection chamber 103 about the point of intersection between the two diagonal lines of the upper surface of the rectangular parallelepiped inspection chamber 103 (chamber). Then, measurement points a, b, c, and d are set by 90-degree shifting to the outer peripheral positions of the primary electron beam column 102 on the upper surface of the inspection chamber 103. In addition, a measurement point e is set at the center position of one of the four side surfaces of the inspection chamber 103.

Figure 5:
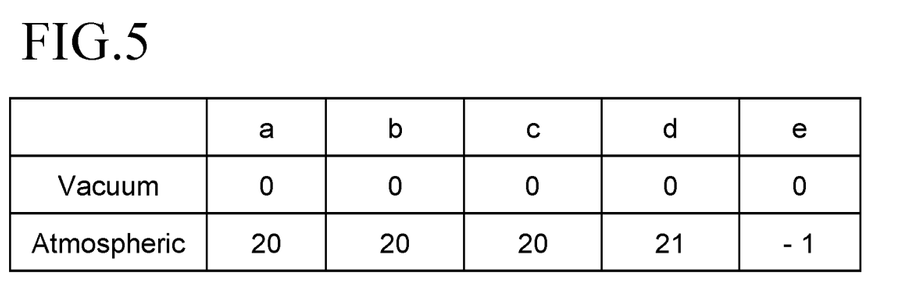
FIG. 5 is a diagram illustrating an example of the result of the measurement of the under-atmospheric pressure chamber displacement and the under-vacuum chamber displacement according to Embodiment 1.

FIG. 5 is a diagram illustrating an example of the result of the measurement of the under-atmospheric pressure chamber displacement and the under-vacuum chamber displacement according to Embodiment 1. Illustrated in the example of FIG. 5 is the result of measurement of the displacement of the inspection chamber 103 that occurs in the case of returning to atmospheric pressure, in which the under-vacuum state of the inspection chamber 103 is a reference (displacement zero). As illustrated in FIG. 5, + displacement (displacement of outward bulging) of substantially the same value (20 µm as an example here) was measured at the measurement points a, b, c, and d. Accordingly, it can be seen that − displacement (displacement of inward recession) of substantially the same value (−20 as an example here) occurs at the measurement points a, b, c, and d in a case where atmospheric pressure is a reference. Accordingly, it can be seen that the primary electron beam column 102 is displaced only in the height (z) direction and no deviation occurs in the x and y plane directions and the direction of rotation. At the measurement point e, − displacement (displacement of inward recession) of, for example, −1 µm was measured. Accordingly, it can be seen that + displacement (displacement of outward bulging) of, for example, +1 µm occurs at the measurement point e in a case where atmospheric pressure is a reference. Here, since the inspection chamber 103 is formed of a flat rectangular parallelepiped that is short in the height direction (Z direction), + displacement at the measurement point e may occur in some cases depending on the degree of flatness.

As described above, according to Embodiment 1, the primary electron beam column 102 undergoes downward (−z direction) displacement, the stage 105 undergoes upward (+z direction) displacement, and the secondary electron beam column 104 undergoes upward rotational displacement from the direction of extension of the secondary electron beam column 104 in a case where the inspection chamber 103 is deformed. Accordingly, although a change in light source-to-measurement target object distance occurs, the angular error is small and the control burden on the primary electron beam optics can be reduced. Specifically, the displacement shortens the distance between the objective lens 207 and the substrate 101 regarding irradiation of multiple primary electron beams, and thus defocusing occurs. In Embodiment 1, the height-direction error of the primary electron beam column 102 and the stage 105 resulting from the differential pressure between the internal and external pressures of the chamber is corrected by a movement of the height of the upper surface of the stage 105. Accordingly, the defocusing can be adjusted by the Z stage 234 of the stage 105. Regarding the secondary electron beam optics, multiple ends are fixed to the corners of the upper surface of the inspection chamber 103 although the incident part of the secondary electron beam is displaced together with the primary electron beam optics, and thus the fixed portion undergoes little displacement and an optical axis error arises as a rotational error. In the secondary electron beam optics, the beam separator 210 and the deflector 212 are capable of controlling the pointing angle of the secondary electron beam. Especially, the pointing angle of the secondary electron beam can be easily controlled by the deflector 212. Specifically, regarding detection of the multiple secondary electron beams 300, the secondary electron beam optics deviates upward, and thus the irradiation positions of the multiple secondary electron beams 300 on the detector 222 deviate. In Embodiment 1, an error in the direction of rotation of the secondary electron beam column 104 resulting from the differential pressure between the internal and external pressures of the chamber is corrected by the deflector 212 deflecting the multiple secondary electron beams 300. Accordingly, regarding the deviation in irradiation position, the trajectory of the multiple secondary electron beams 300 can be adjusted by the angle of the deflector 212 being allowed to deviate in accordance with the deviation of the secondary electron beam optics. As a result, an irradiation-position deviation of the multiple secondary electron beams 300 on the detector 222 can be corrected with high precision. According to Embodiment 1, deviations in the x and y directions can be forestalled, and thus the correction can be facilitated.

Figure 6:
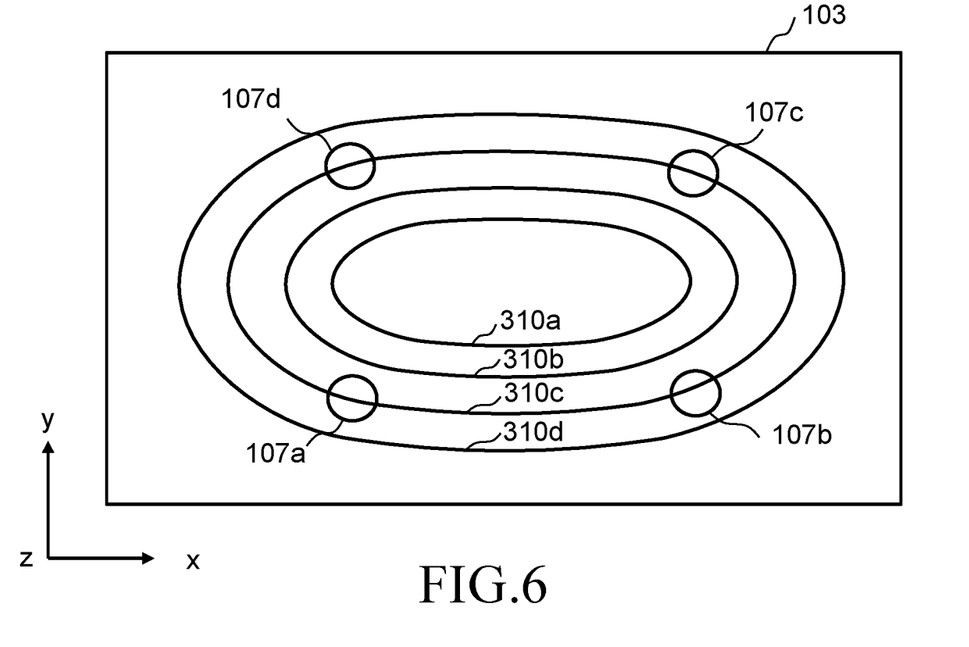
FIG. 6 is a diagram illustrating an example of the relationship between the disposition position of a stage pedestal and a contour line on a bottom plate inside surface of the chamber according to Embodiment 1.

FIG. 6 is a diagram illustrating an example of the relationship between the disposition position of the stage pedestal and the contour line on the bottom plate inside surface of the chamber according to Embodiment 1. As illustrated in FIG. 6, the stage pedestals 107a to 107d may be disposed on the same contour line (such as a contour line 310c) in a case where contour lines 310a to 310d on the bottom plate inside surface of the inspection chamber 103 (chamber) elliptically spread in the form of ripples and to the outer side (in the x and y directions).

Figure 7:
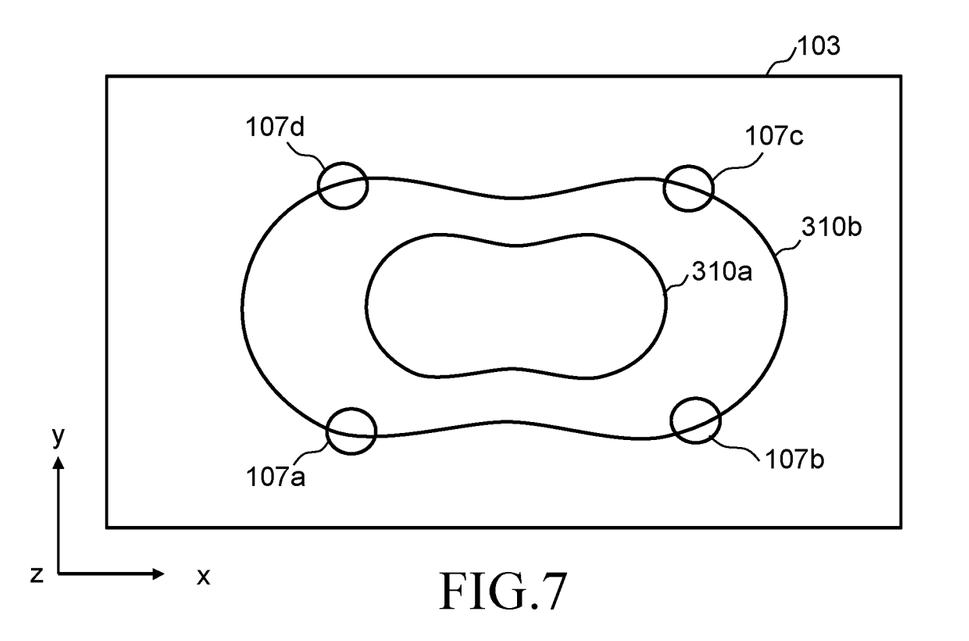
FIG. 7 is a diagram illustrating another example of the relationship between the disposition position of the stage pedestal and the contour line on the bottom plate inside surface of the chamber according to Embodiment 1.

FIG. 7 is a diagram illustrating another example of the relationship between the disposition position of the stage pedestal and the contour line on the bottom plate inside surface of the chamber according to Embodiment 1. As illustrated in FIG. 7, the stage pedestals 107a to 107d may be disposed on the same contour line (such as the contour line 310b) even in a case where the contour lines 310a to 310b on the bottom plate inside surface of the inspection chamber 103 (chamber) are formed with irregular trajectories. Then, it is possible to forestall non-z direction deviations of the height position of the upper surface of the stage 105 even in a case where the inspection chamber 103 (chamber) is deformed.

Figure 8A:
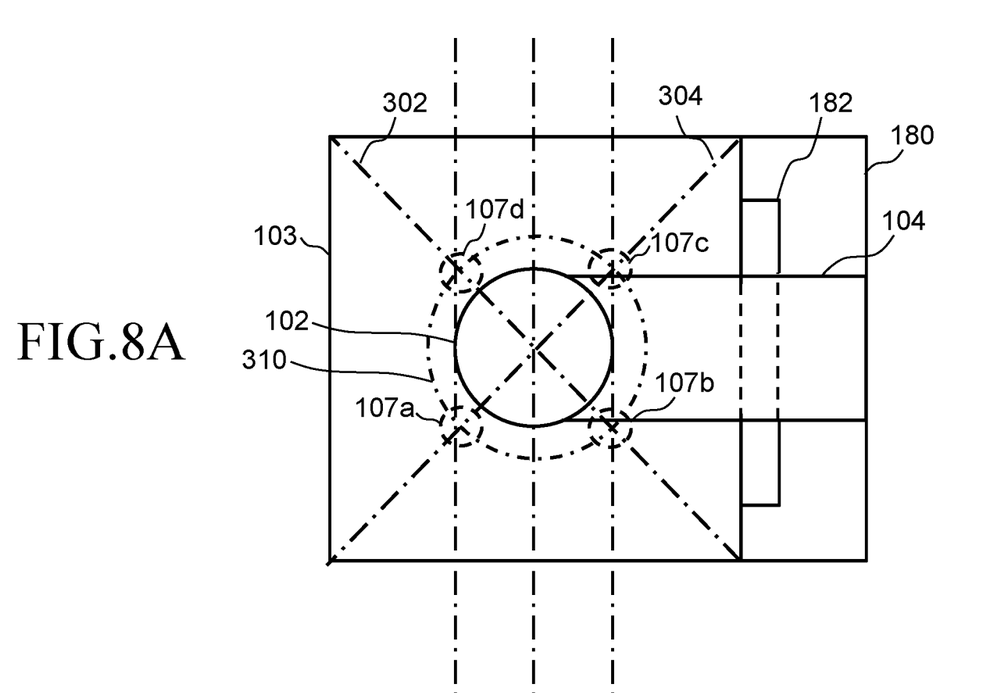
FIGS. 8A and 8B are diagrams illustrating another example of the disposition configuration of the primary electron beam column, the inspection chamber, and the secondary electron beam column according to Embodiment 1.
Figure 8B:
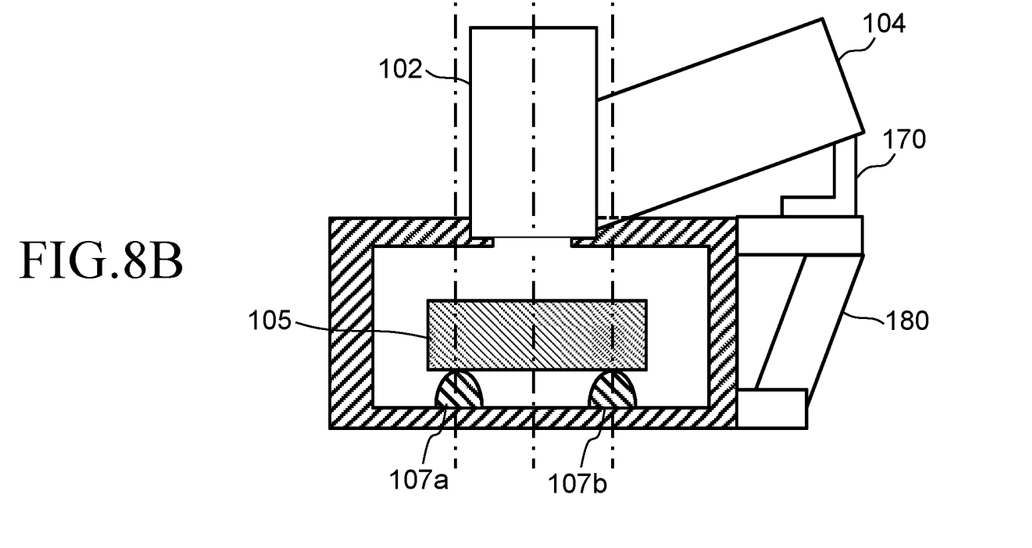

FIGS. 8A and 8B are diagrams illustrating another example of the disposition configuration of the primary electron beam column, the inspection chamber, and the secondary electron beam column according to Embodiment 1. A top view is illustrated in FIG. 8A and a cross-sectional view is illustrated in FIG. 8B. Illustrated in the example of FIGS. 8A and 8B is, for example, a case where the inspection chamber 103 that is a flat rectangular parallelepiped, is short in the height direction (Z direction), and has square upper and lower surfaces is used as in the example of FIGS. 3A and 3B. In addition, in the inspection chamber 103, plate material combination constitutes the six surfaces of the rectangular parallelepiped. In the example of FIGS. 8A and 8B, the secondary electron beam column 104 (secondary electron optical column) extends diagonally upward toward the side of one of the four sides of the upper surface of the inspection chamber 103. The secondary electron beam column 104 (secondary electron optical column) is supported by connection to the lower portion of the primary electron beam column 102 and supported by the stay 170, which is disposed on an optical column support table 180 separate from the inspection chamber 103. In other words, a case is illustrated where the secondary electron beam column 104 (secondary electron optical column) is supported by connection to the lower portion of the primary electron beam column 102 and supported via the stay 170 by the optical column support table 180 separate from the inspection chamber 103. The optical column support table 180 is connected to the inspection chamber 103 at the four corners of the side surface of the inspection chamber 103 with a gap 182 between the middle portion of the optical column support table 180 and the inspection chamber 103. As described with reference to FIG. 2B, the upper and lower surfaces of the inspection chamber 103 are deformed inward and the lateral direction of the inspection chamber 103 is deformed outward due to the differential pressure between the inside and the outside of the inspection chamber 103. Here, the optical column support table 180 is separate from the inspection chamber 103, and thus upward and downward displacement attributable to deformation of the inspection chamber 103 can be forestalled. Further, the gap 182 is between the middle portion of the optical column support table 180 and the inspection chamber 103, and thus it is possible to prevent the optical column support table 180 from being pushed by the side plate of the inspection chamber 103. In other words, it is possible to forestall displacement in the x and y plane directions and the z direction. Accordingly, the stay 170 is not displaced by deformation of the inspection chamber 103. As a result, the point that is on the optical column support table 180 side as one of the two points that support the secondary electron beam column 104 is capable of maintaining the same position regardless of deformation of the inspection chamber 103.

In FIGS. 8A and 8B, the primary electron beam column 102 (primary electron optical column) is placed on the upper surface of the inspection chamber 103 about the point of intersection between the two diagonal lines 302 and 304 of the upper surface of the rectangular parallelepiped inspection chamber 103 (chamber) as in the example of FIGS. 3A and 3B. Accordingly, regarding the primary electron beam column 102, it is possible to concentrate on displacement in the height (z) direction without causing any deviation in the x and y plane directions and the direction of rotation.

Accordingly, in a case where the inspection chamber 103 is deformed, only the height-direction rotational error Δθ is caused in the secondary electron beam column 104 by downward (−z direction) displacement of the primary electron beam column 102. As a result, the point of displacement can be one. In other words, it is possible to concentrate on the height-direction rotational error Δθ attributable to single-point displacement without causing any deviation in the x and y plane directions.

In the example of FIGS. 8A and 8B, the plurality of stage pedestals 107a to 107d, which are three or more in number, are disposed on the contour line 310 in a state of being deformed by the differential pressure between the internal and external pressures of the inspection chamber 103 on the bottom plate inside surface of the inspection chamber 103 (chamber) as in the example of FIGS. 3A and 3B. The stage 105 is supported by the plurality of stage pedestals 107a to 107d. As a result, the stage pedestals 107a to 107d are capable of having the same height position even in a case where the inspection chamber 103 is deformed. Accordingly, the stage 105 is displaced only in the height (z) direction. In other words, it is possible to concentrate on displacement in the height (z) direction without causing any deviation in the x and y plane directions and the direction of rotation.

In the example of FIGS. 8A and 8B, the height-direction error of the primary electron beam column 102 and the stage 105 resulting from the differential pressure between the internal and external pressures of the inspection chamber 103 may be corrected by a movement of the height of the upper surface of the stage 105 as described above. Accordingly, the defocusing can be adjusted by the Z stage 234 of the stage 105. An error in the direction of rotation of the secondary electron beam column 104 resulting from the differential pressure between the internal and external pressures of the inspection chamber 103 may be corrected by the deflector 212 deflecting the multiple secondary electron beams 300 as described above.

Although a case where the inspection chamber 103 that is a flat rectangular parallelepiped, is short in the height direction (Z direction), and has square upper and lower surfaces is used has been described in the above example, the embodiments are not limit thereto.

Figure 9A:
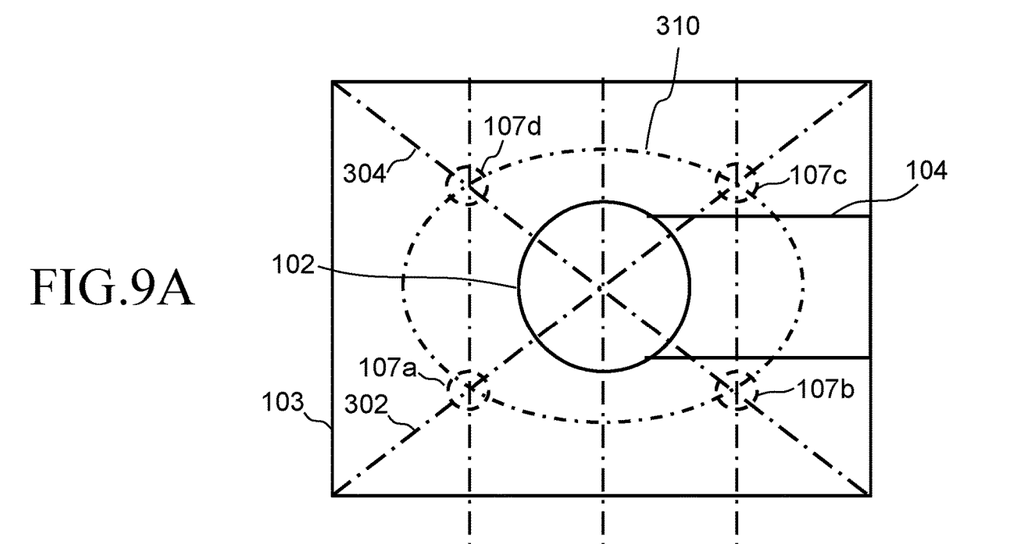
FIGS. 9A and 9B are diagrams illustrating another example of the disposition configuration of the primary electron beam column, the inspection chamber, and the secondary electron beam column according to Embodiment 1.
Figure 9B:
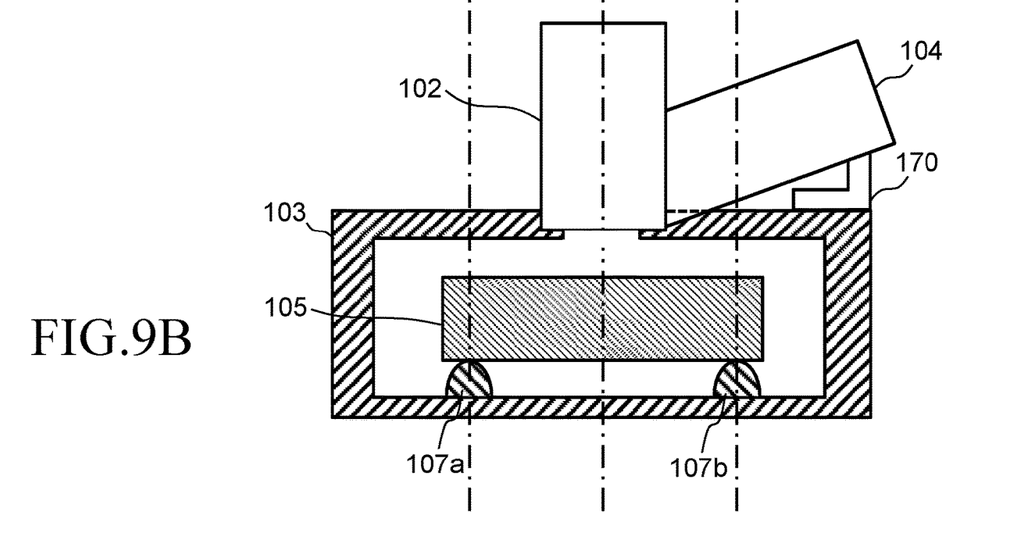

FIGS. 9A and 9B are diagrams illustrating another example of the disposition configuration of the primary electron beam column, the inspection chamber, and the secondary electron beam column according to Embodiment 1. A top view is illustrated in FIG. 9A and a cross-sectional view is illustrated in FIG. 9B. Illustrated in the example of FIGS. 9A and 9B is, for example, a case where the inspection chamber 103 that is a flat rectangular parallelepiped, is short in the height direction (Z direction), and has rectangular upper and lower surfaces is used. In addition, in the inspection chamber 103, plate material combination constitutes the six surfaces of the rectangular parallelepiped. In the example of FIGS. 9A and 9B, the secondary electron beam column 104 (secondary electron optical column) extends diagonally upward toward the side of one of the two short sides that constitute the four sides of the upper surface of the inspection chamber 103. The secondary electron beam column 104 (secondary electron optical column) is supported by connection to the lower portion of the primary electron beam column 102 and supported by the stay 170, which is disposed on one side of the outer peripheral portion of the upper surface of the inspection chamber 103 that is in the direction of extension of the secondary electron beam column 104.

In FIGS. 9A and 9B, the primary electron beam column 102 (primary electron optical column) is placed on the upper surface of the inspection chamber 103 about the point of intersection between the two diagonal lines 302 and 304 of the upper surface of the rectangular parallelepiped inspection chamber 103 (chamber). Accordingly, regarding the primary electron beam column 102, it is possible to concentrate on displacement in the height (z) direction without causing any deviation in the x and y plane directions and the direction of rotation.

In a case where the inspection chamber 103 is deformed, only the height-direction rotational error Δθ is caused in the secondary electron beam column 104 by downward (−z direction) displacement of the primary electron beam column 102 and displacement of the outer peripheral portion of the upper surface of the inspection chamber 103. In other words, it is possible to concentrate on the height-direction rotational error Δθ without causing any deviation in the x and y plane directions.

In the example of FIGS. 9A and 9B, the plurality of stage pedestals 107a to 107d, which are three or more in number, are disposed on the contour line 310 in a state of being deformed by the differential pressure between the internal and external pressures of the inspection chamber 103 on the bottom plate inside surface of the inspection chamber 103 (chamber). The stage 105 is supported by the plurality of stage pedestals 107a to 107d. As a result, the stage pedestals 107a to 107d are capable of having the same height position even in a case where the inspection chamber 103 is deformed. Accordingly, the stage 105 is displaced only in the height (z) direction. In other words, it is possible to concentrate on displacement in the height (z) direction without causing any deviation in the x and y plane directions and the direction of rotation.

Although not illustrated, the secondary electron beam column 104 (secondary electron optical column) may extend diagonally upward toward the side of one of the two long sides that constitute the four sides of the upper surface of the inspection chamber 103. It is also preferable that the secondary electron beam column 104 (secondary electron optical column) is supported by connection to the lower portion of the primary electron beam column 102 and supported by the stay 170 disposed on the above-described optical column support table 180 separate from the inspection chamber 103.

The following operation is performed as an example in a case where pattern inspection is performed on the substrate 101 by means of the inspection apparatus 100.

A bundle of secondary electrons (multiple secondary electron beams 300, dotted line in FIG. 1) is emitted from the substrate 101 by the desired positions of the substrate 101 being irradiated with the focus-corrected multiple primary electron beams 20 and the secondary electrons include reflected electrons and correspond to the respective beams of the multiple primary electron beams 20 as described above. The multiple secondary electron beams 300 are projected onto the detector 222 by the rotational error-corrected secondary electron beam optics. The detector 222 detects the multiple secondary electron beams 300 in this manner.

As described above, the image acquisition mechanism 150 performs scanning on the figure-formed inspection target substrate 101 by using the multiple primary electron beams 20 and detects the multiple secondary electrons 300 emitted from the inspection target substrate 101 as a result of irradiation with the multiple primary electron beams 20. Detection data (measurement image: secondary electron image: inspection target image) on the secondary electron from each measurement pixel 36 detected by the detector 222 is output to the detection circuit 106 in the order of measurement. The analog detection data is converted into digital data by an A/D converter (not illustrated) in the detection circuit 106 and the chip pattern memory 123 stores the digital data. In this manner, the image acquisition mechanism 150 acquires a measurement image on the pattern formed on the substrate 101. Then, at a stage where one-chip detection data is accumulated, for example, the data is transferred to the comparison circuit 108 as chip pattern data along with information indicating each position from the position circuit 127.

In the comparison circuit 108, an image of a predetermined size is generated from the transferred stripe pattern data (or the chip pattern data). Then, images of the same pattern are compared (die-to-die inspection). The comparison circuit 108 compares the two for each pixel in accordance with a predetermined determination condition and determines the presence or absence of a defect such as a shape defect. For example, a tone value difference for each pixel exceeding the determination threshold Th is determined as a defect. Then, the result of the comparison is output. The comparison result may be output to the storage device 109 or the memory 118 or may be output by a printer (not illustrated) or the like. Alternatively, a reference image as a comparison target may be created by means of design data that is the source of pattern formation on the substrate 101 and comparison may be performed between the reference image and the inspection target image (die-database inspection).

As described above, according to Embodiment 1, it is possible to facilitate correction of an error in positional relationship, even in the event of deformation of the inspection chamber 103 attributable to the differential pressure between the internal pressure of the inspection chamber 103 and atmospheric pressure, by vacuumizing the inside of the inspection chamber 103 (chamber).

In the above description, a series of "circuits" includes a processing circuit. The processing circuit includes an electric circuit, a computer, a processor, a circuit board, a quantum circuit, a semiconductor device, or the like. In addition, each "circuit" may use a common processing circuit (the same processing circuit). Alternatively, different processing circuits (separate processing circuits) may be used. A program for executing the processor or the like may be recorded on a record carrier body such as a magnetic disk drive, a magnetic tape device, an FD, and a read-only memory (ROM). For example, the above-described one or more processing circuits may constitute the position circuit 127, the comparison circuit 108, the stage control circuit 112, and the like.

An embodiment has been described above with reference to specific examples. The embodiments are not limited to the specific examples.

Although parts and the like that are not directly necessary for the description of the embodiments, such as device configurations and control methods, are not described here, necessary device configurations and control methods can be appropriately selected and used.

Every electron beam image acquisition apparatus that is equipped with elements of the embodiments and can be appropriately changed in design by those skilled in the art is within the scope of the embodiments.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam image acquisition apparatus comprising:
    a rectangular parallelepiped chamber where a target object is disposed;
    a primary electron optical column placed on an upper surface of the chamber so that a point of intersection between two diagonal lines on the upper surface of the chamber is located at a center of a horizontal section of the primary electron optical column, a primary charged particle beam optics irradiating the target object with a primary charged particle beam being disposed in the primary electron optical column;
    a secondary electron optical column connected to a lower portion of the primary electron optical column, a secondary charged particle beam optics being disposed in the secondary electron optical column and a secondary charged particle beam emitted as a result of an irradiation of the target object with the primary charged particle beam passing through the secondary charged particle beam optics;
    a plurality of stage pedestals disposed on a same contour line in a state of being deformed by a differential pressure between internal and external pressures of the chamber on a bottom plate inside surface of the chamber, the stage pedestals being three or more in number; and
    a stage supported by the plurality of stage pedestals and movable in a height direction, the target object being placed on the stage.

2. The apparatus according to claim 1, wherein
    the secondary electron optical column is supported by the connection to the lower portion of the primary electron optical column and supported in an outer peripheral portion of the upper surface of the chamber, the secondary charged particle beam optics has a deflector, and an error in a direction of rotation of the secondary electron optical column resulting from a differential pressure between internal and external pressures of the chamber is corrected by deflection of the secondary charged particle beam by the deflector.

3. The apparatus according to claim 1, wherein the secondary electron optical column is supported by the connection to the lower portion of the primary electron optical column and supported by an optical column support table separate from the chamber, the secondary charged particle beam optics has a deflector, and an error in a direction of rotation of the secondary electron optical column resulting from a differential pressure between internal and external pressures of the chamber is corrected by deflection of the secondary charged particle beam by the deflector.

4. The apparatus according to claim 3, wherein the optical column support table is connected to the chamber at four corners of a side surface of the chamber with a gap between a middle portion of the optical column support table and the chamber.

5. The apparatus according to claim 1, wherein the secondary electron optical column extends diagonally upward from the lower portion of the primary electron optical column, the apparatus further comprising:

a stay disposed in an outer peripheral portion of the upper surface of the chamber and supporting an upper portion of the secondary electron optical column.

6. The apparatus according to claim 1, wherein the secondary electron optical column extends diagonally upward from the lower portion of the primary electron optical column, the apparatus further comprising:

an optical column support table connected to a side surface of the chamber and separate from the chamber; and a stay disposed on the optical column support table and supporting an upper portion of the secondary electron optical column.

7. The apparatus according to claim 1, wherein the contour line is formed with an irregular trajectory.

8. The apparatus according to claim 1, wherein the upper surface of the chamber has a rectangular shape, and the secondary electron optical column extends diagonally upward toward a side of one of two short sides constituting four sides of the rectangular shape.

9. The apparatus according to claim 6, wherein the upper surface of the chamber has a square shape, and the optical column support table is connected to a side surface of the chamber in a direction of the diagonally upward extension of the secondary electron optical column.

* * * * *